US012724054B2

(12) United States Patent
Faghih Imani et al.

(10) Patent No.: US 12,724,054 B2
(45) Date of Patent: Sep. 1, 2026

(54) SYSTEM AND METHOD FOR ESTIMATING AN ANGLE OF ARRIVAL

(71) Applicants: Seyedmohammadreza Faghih Imani, Phoenix, AZ (US); Abu Huraira Muhammad Idban, Tempe, AZ (US)

(72) Inventors: Seyedmohammadreza Faghih Imani, Phoenix, AZ (US); Abu Huraira Muhammad Idban, Tempe, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 18/820,180

(22) Filed: Aug. 29, 2024

(65) Prior Publication Data

US 2025/0076358 A1 Mar. 6, 2025

Related U.S. Application Data

(60) Provisional application No. 63/579,936, filed on Aug. 31, 2023.

(51) Int. Cl.

*G01R 29/10* (2006.01)
*G01R 29/08* (2006.01)
*H01Q 21/20* (2006.01)

(52) U.S. Cl.

CPC ......... *G01R 29/10* (2013.01); *G01R 29/0892* (2013.01); *H01Q 21/20* (2013.01)

(58) Field of Classification Search

CPC .......... H01Q 21/20; H01Q 1/38; H01Q 15/00; H01Q 21/00; H01Q 21/0056; H01Q 21/06–08

See application file for complete search history.

(56) References Cited

U.S. PATENT DOCUMENTS 8,760,352 B2 * 6/2014 Rao .......................... H01Q 1/40 343/702
9,640,858 B1 * 5/2017 Islam ....................... H01Q 1/38
11,289,822 B2 * 3/2022 Goto .................... H01Q 9/0407
11,682,822 B1 * 6/2023 Johnson ................. H01Q 13/10 343/709

OTHER PUBLICATIONS

Alamzadeh, I. et al., "A reconfigurable intelligent surface with integrated sensing capability", Scientific Reports, 2021, pp. 1-10.

(Continued)

*Primary Examiner* — Hasan Islam
(74) *Attorney, Agent, or Firm* — Womble Bond Dickinson (US) LLP; Martin W. Regehr

(57) ABSTRACT

A system and method for estimating an angle of arrival. In some embodiments, the system includes an array antenna and a processing circuit. The array antenna may be curved, and may include a first radiator having a first resonant frequency and a second radiator having a second resonant frequency different from the first resonant frequency. The processing circuit may be configured to receive a signal from the array antenna and to calculate, from the signal, an estimated angle of arrival of electromagnetic radiation corresponding to the signal.

13 Claims, 5 Drawing Sheets

(56) References Cited

OTHER PUBLICATIONS

Alamzadeh, I. et al., "Sensing and Reconfigurable Reflection of Electromagnetic Waves From a Metasurface With Sparse Sensing Elements", IEEE Access, Sep. 27, 2022, pp. 105954-105965, vol. 10, IEEE.
Alamzadeh, I. et al., "Detecting Angle of Arrival on a Hybrid RIS Using Intensity-Only Data", IEEE Antennas and Wireless Propagation Letters, Jun. 21, 2023, pp. 2325-2329, vol. 22, No. 9, IEEE.
Amjad, F. et al., "Aircraft position estimation using angle of arrival of received radar signals", Bulletin of Electrical Engineering and Informatics, Dec. 2020, pp. 2380-2387, vol. 9, No. 6.
Berni, A., "Angle-of-Arrival Estimation Using an Adaptive Antenna Array", IEEE Transactions on Aerospace and Electronic Systems, Mar. 1975, pp. 278-284, IEEE.
Budhu, J. et al., "Design of Planar and Conformal, Passive, Lossless Metasurfaces That Beamform", IEEE Journal of Microwaves, Jul. 2022, pp. 401-418, vol. 2, No. 3, IEEE.
Celenk, E. et al., "Frequency Scanning Conformal Sensor Based on SIW Metamaterial Antenna", IEEE Sensors Journal, Apr. 26, 2021, pp. 16015-16023, vol. 21, No. 14, IEEE.
Chen, H-C. et al., "Determining RF Angle of Arrival Using COTS Antenna Arrays: A Field Evaluation", IEEE Xplore, 2012, 6 pages, IEEE.
Chengtian, S. et al., "Conformal transmitarray based on metasurface fed by miniaturized filtering antenna", Microwave and Optical Technology Letters, 2023, pp. 217-224.
Fan, K. et al., "Cylindrical Conformal Array Antenna With Tilted H-Plane Fanshaped Beam for Millimeter-Wave Application", Microwave and Optical Technology Letters, Jul. 2016, pp. 1666-1671, vol. 58, No. 7.
Gao, K. et al., "Characteristic mode analysis of wideband high-gain and low-profile metasurface antenna", Chinese Physics B, 2021, pp. 064101-1-064101-7, vol. 30, No. 6.
Ge, R. et al., "A Study on Conformal Metasurface Influences on Passive Beam Steering", Electronics, Feb. 22, 2022, pp. 1-15.
Gollub, J. et al., "Large Metasurface Aperture for Millimeter Wave Computational Imaging at the Human-Scale", Scientific Reports, Feb. 20, 2017, pp. 1-9.
Hao, Z-C. et al., "Design of a Millimeter-Wave High Angle Selectivity Shaped-Beam Conformal Array Antenna Using Hybrid Genetic/Space Mapping Method", IEEE Antennas and Wireless Propagation Letters, Nov. 18, 2015, pp. 1208-1212, vol. 15, IEEE.
Hashemi, M. et al., "Electronically Controlled Metamaterial-Based Leaky-Wave Transmission-Line for Conformal Surface Applications", IEEE Xplore, 2009, pp. 69-72.
Holdsworth, D., "Angle of arrival estimation for all-sky interferometric meteor radar systems", Radio Science, Dec. 6, 2005, pp. 1-8, vol. 40.
Hunt, J. et al., "Metamaterial Apertures for Computational Imaging", www.sciencemag.org, Jan. 18, 2013, pp. 310-313, vol. 339.
Imani, M. et al., "Review of Metasurface Antennas for Computational Microwave Imaging", IEEE Transactions on Antennas and Propagation, Jan. 28, 2020, pp. 1860-1875, vol. 68, No. 3, IEEE.
Imani, M. et al., "Conformal Frequency-Diverse Metasurface for Computational AoA Detection", in *IEEE Antennas and Wireless Propagation Letters,* Nov. 2023, pp. 2634-2638, vol. 22, No. 11, IEEE.
Jackson, B. et al., "Direction of Arrival Estimation Using Directive Antennas in Uniform Circular Arrays", IEEE Transactions on Antennas and Propagation, Dec. 22, 2014, pp. 736-747, vol. 63, No. 2, IEEE.
Landy, N. et al., "Homogenization analysis of complementary waveguide metamaterials", Photonics and Nanostructures—Fundamentals and Applications, 2013, pp. 453-467, Elsevier.
Lange, O. et al., "Antenna Geometry Optimization for 2D Direction-of-Arrival Estimation for Radar Imaging", IEEE Xplore, 2011, 8 pages, IEEE.
Li, M. et al., "Angle-Of-Arrival Estimation for Localization and Communication in Wireless Networks", 16th European Signal Processing Conference (EUSIPCO 2008), Aug. 25-29, 2008, 5 pages, IEEE Xplore.
Marks, D. et al., "Spatially resolving antenna arrays using frequency diversity", Journal of the Optical Society of America A, Apr. 18, 2016, pp. 899-912, vol. 33, No. 5.
Marinez-Ros, A. et al., "Conformal Tapered Substrate Integrated Waveguide Leaky-Wave Antenna", IEEE Transactions on Antennas and Propagation, Sep. 29, 2014, pp. 5983-5991, vol. 62, No. 12, IEEE.
Mohanna, M. et al., "Optimization of MUSIC algorithm for angle of arrival estimation in wireless communications", NRIAG Journal of Astronomy and Geophysics, 2013, pp. 116-124.
Molaei, A. et al., "Efficient Joint Estimation of DOA, Range and Reflectivity in Near-Field by Using Mixed-Order Statistics and a Symmetric MIMO Array", IEEE Transactions on Vehicular Technology, Dec. 24, 2021, pp. 2824-2842, vol. 71, No. 3, IEEE.
Naseri, M. et al., "Machine Learning-Based Angle of Arrival Estimation for Ultra-Wide Band Radios", IEEE Communications Letters, Apr. 13, 2022, pp. 1273-1277, vol. 26, No. 6, IEEE.
Padin, S., "A Wideband Analog Continuum Correlator for Radio Astronomy", IEEE Transactions on Instrumentation and Measurement, Dec. 1994, pp. 782-785, vol. 43, No. 6, IEEE.
Pavlenko, T., et al., "Design of Sparse Dome Antenna Array for Angle of Arrival Localization Systems", 13th European Conference on Antennas and Propagation, EuCAP, 2019, 4 pages.
Peng, R., et al., "Angle of Arrival Localization for Wireless Sensor Networks", IEEE Secon 2006 Proceedings, 2006, pp. 374-382, IEEE.
Ramalingam, S., et al., "Axially Modulated Cylindrical Metasurface Leaky-Wave Antennas", IEEE Antennas and Wireless Propagation Letters, Jan. 2018, pp. 130-133, vol. 17, No. 1, IEEE.
Rano, D., et al., "Electromagnetic Measurements Geometric Method for Determining the Phase Shift in the Reflection of an Electromagnetic Wave From a Conformal Meta-Surface of a Sensing Element", Measurement Techniques, Jul. 2022, pp. 273-278, vol. 65, No. 4, Springer Science+Business Media, LLC.
Ruf, C., "Digital Correlators for Synthetic Aperture Interferometric Radiometry", IEEE Transactions on Geoscience and Remote Sensing, Sep. 1995, pp. 1222-1229, vol. 33, No. 5, IEEE.
Shen, Q., et al., "Underdetermined DOA Estimation Under the Compressive Sensing Framework: A Review", Open Access Journal, 2016, pp. 8865-8878, vol. 4.
Sleasman, T., et al., "Single-frequency microwave imaging with dynamic metasurface apertures", Journal of the Optical Society of America, Aug. 2017, pp. 1713-1726, vol. 34, No. 8, Optical Society of America.
Sleasman, T., et al., "Computational Imaging With Dynamic Metasurfaces", IEEE Antennas & Propagation Magazine, Aug. 2022, pp. 123-134, IEEE.
Wang, Y., et al., "A Prismatic Conformal Metasurface for Radar Cross-Sectional Reduction", IEEE Antennas and Wireless Propagation Letters, Apr. 2020, pp. 631-635, vol. 19, No. 4, IEEE.
Wang, J., et al., "Generating High-Purity Directive Circularly Polarized Beams From Conformal Anisotropic Holographic Metasurfaces", IEEE Transactions on Antennas and Propagation, Nov. 2022, pp. 10718-10723, vol. 70, No. 11, IEEE.
Worms, J., "Superresolution with Conformal Broadband Antenna Arrays", Proceedings of the 2002 IEEE Radar Conference, 2002, pp. 425-431, IEEE.
Wu, C., "Multiemitter Two-Dimensional Angle-of-Arrival Estimator via Compressive Sensing", IEEE Transactions on Aerospace and Electronic Systems, 2019, pp. 2884-2895, vol. 56, No. 4, Canadian-Crown.
Yoo, I., et al., "Design of Conformal Array of Rectangular Waveguide-Fed Metasurfaces", IEEE Transactions on Antennas and Propagation, Jul. 2022, pp. 6060-6065, vol. 70, No. 7, IEEE.
Yurduseven, O., et al., "Frequency-Diverse Computational Direction of Arrival Estimation Technique", Scientific Reports, 2019, pp. 1-12, www.nature.com/scientificreports.

(56) References Cited

OTHER PUBLICATIONS

Zhang, B., et al., “Cognitive Conformal Antenna Array Exploiting Deep Reinforcement Learning Method”, IEEE Transactions on Antennas and Propagation, Jul. 2022, p. 5094-5104, vol. 70., No. 7, IEEE.

* cited by examiner

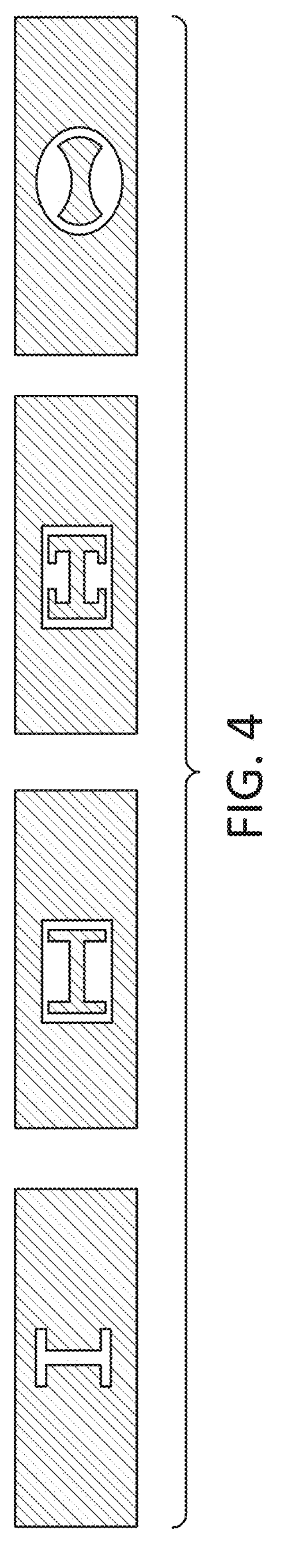
FIG. 4
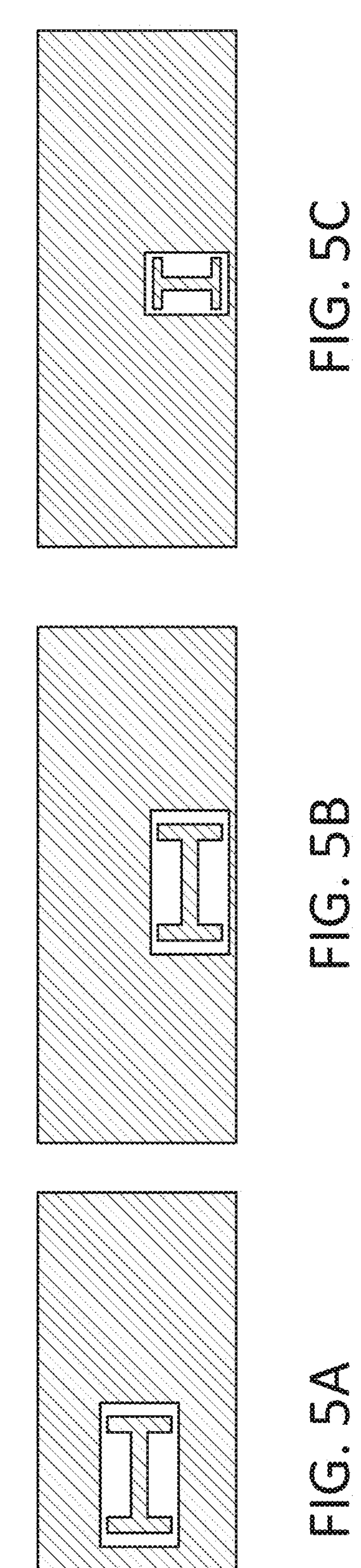
FIG. 5C
FIG. 5B
FIG. 5A

SYSTEM AND METHOD FOR ESTIMATING AN ANGLE OF ARRIVAL

CROSS-REFERENCE TO RELATED APPLICATION(S)

The present application claims priority to and the benefit of U.S. Provisional Application No. 63/579,936, filed Aug. 31, 2023, entitled "SYSTEM AND METHOD FOR ESTIMATING AN ANGLE OF ARRIVAL", the entire content of which is incorporated herein by reference.

GOVERNMENT LICENSE RIGHTS

This invention was made with government support under 2030068 awarded by the National Science Foundation. The government has certain rights in the invention.

FIELD

One or more aspects of embodiments according to the present disclosure relate to systems for transmitting and receiving electromagnetic radiation, and more particularly to a system and method for estimating an angle of arrival.

BACKGROUND

Detecting the angle of arrival (angle of arrival) of electromagnetic waves is an important function in a variety of applications such as navigation and wireless communication.

It is with respect to this general technical environment that aspects of the present disclosure are related.

SUMMARY

According to an embodiment of the present disclosure, there is provided a system, including: an array antenna; and a processing circuit, the array antenna being curved, the array antenna including a first radiator having a first resonant frequency and a second radiator having a second resonant frequency different from the first resonant frequency, the processing circuit being configured to receive a signal from the array antenna and to calculate, from the signal, an estimated angle of arrival of an electromagnetic radiation corresponding to the signal.

In some embodiments: the first radiator is a complementary I-shaped resonator, and the second radiator is a complementary I-shaped resonator.

In some embodiments, the array antenna includes a substrate integrated waveguide.

In some embodiments, the system includes a plurality of radiators, including the first radiator and the second radiator, the plurality of radiators including at least 10 radiators.

In some embodiments, the substrate integrated waveguide has the shape of a hollow cylinder.

In some embodiments, the radiators of the plurality of radiators are uniformly spaced around the hollow cylinder.

In some embodiments, each of the plurality of radiators has a respective resonant frequency, the respective resonant frequency being randomly selected.

In some embodiments, the array antenna has a first feed and a second feed.

In some embodiments, the two feeds are at diametrically opposed positions on the hollow cylinder.

In some embodiments, the calculating of the angle of arrival includes calculating a normalized cross correlation vector, the normalized cross correlation vector including, for each of a plurality of frequencies, a normalized cross correlation of a signal at the first feed and a signal at the second feed.

In some embodiments, the calculating further includes: calculating, for a first tentative angle of arrival, a first discrepancy, the first discrepancy being a measure of the difference between a reference normalized cross correlation vector and the calculated normalized cross correlation vector; calculating, for a second tentative angle of arrival, a second discrepancy, the second discrepancy being a measure of the difference between a reference normalized cross correlation vector and the calculated normalized cross correlation vector; determining that the first discrepancy is greater than the second discrepancy; and setting the estimated angle of arrival equal to the second tentative angle of arrival.

In some embodiments, the calculating further includes calculating the estimated angle of arrival using ridge regression based on a reference response of the array antenna for a plurality of angles of arrival.

According to an embodiment of the present disclosure, there is provided a method, including: receiving an electromagnetic signal with an array antenna, to generate an antenna signal; and calculating, from the antenna signal, an estimated angle of arrival of the electromagnetic signal, wherein: the array antenna is curved, the array antenna has a first feed and a second feed, and the array antenna includes a first radiator having a first resonant frequency and a second radiator having a second resonant frequency different from the first resonant frequency.

In some embodiments: the first radiator is a complementary I-shaped resonator, and the second radiator is a complementary I-shaped resonator.

In some embodiments, the array antenna includes a substrate integrated waveguide.

In some embodiments, the array antenna includes a plurality of radiators, including the first radiator and the second radiator, the plurality of radiators including at least 10 radiators.

In some embodiments, the substrate integrated waveguide has the shape of a hollow cylinder.

In some embodiments, the calculating of the angle of arrival includes calculating a normalized cross correlation vector, the normalized cross correlation vector including, for each of a plurality of frequencies, a normalized cross correlation of a signal at the first feed and a signal at the second feed.

In some embodiments, the calculating further includes: calculating, for a first tentative angle of arrival, a first discrepancy, the first discrepancy being a measure of the difference between a reference normalized cross correlation vector and the calculated normalized cross correlation vector; calculating, for a second tentative angle of arrival, a second discrepancy, the second discrepancy being a measure of the difference between a reference normalized cross correlation vector and the calculated normalized cross correlation vector; determining that the first discrepancy is greater than the second discrepancy; and setting the estimated angle of arrival equal to the second tentative angle of arrival.

In some embodiments, the calculating further includes calculating the estimated angle of arrival using ridge regression based on a reference response of the array antenna for a plurality of angles of arrival.

BRIEF DESCRIPTION OF THE DRAWINGS

These and other features and advantages of the present disclosure will be appreciated and understood with reference to the specification, claims, and appended drawings wherein:

FIG. 4 includes a schematic diagram of each of four kinds of antenna elements, according to some embodiments of the present disclosure;

FIG. 5A is a plan view of a first position and orientation of an antenna element, according to an embodiment of the present disclosure;

FIG. 5B is a plan view of a second position and orientation of an antenna element, according to an embodiment of the present disclosure;

FIG. 5C is a plan view of a third position and orientation of an antenna element, according to an embodiment of the present disclosure.

DETAILED DESCRIPTION

Figure 1:
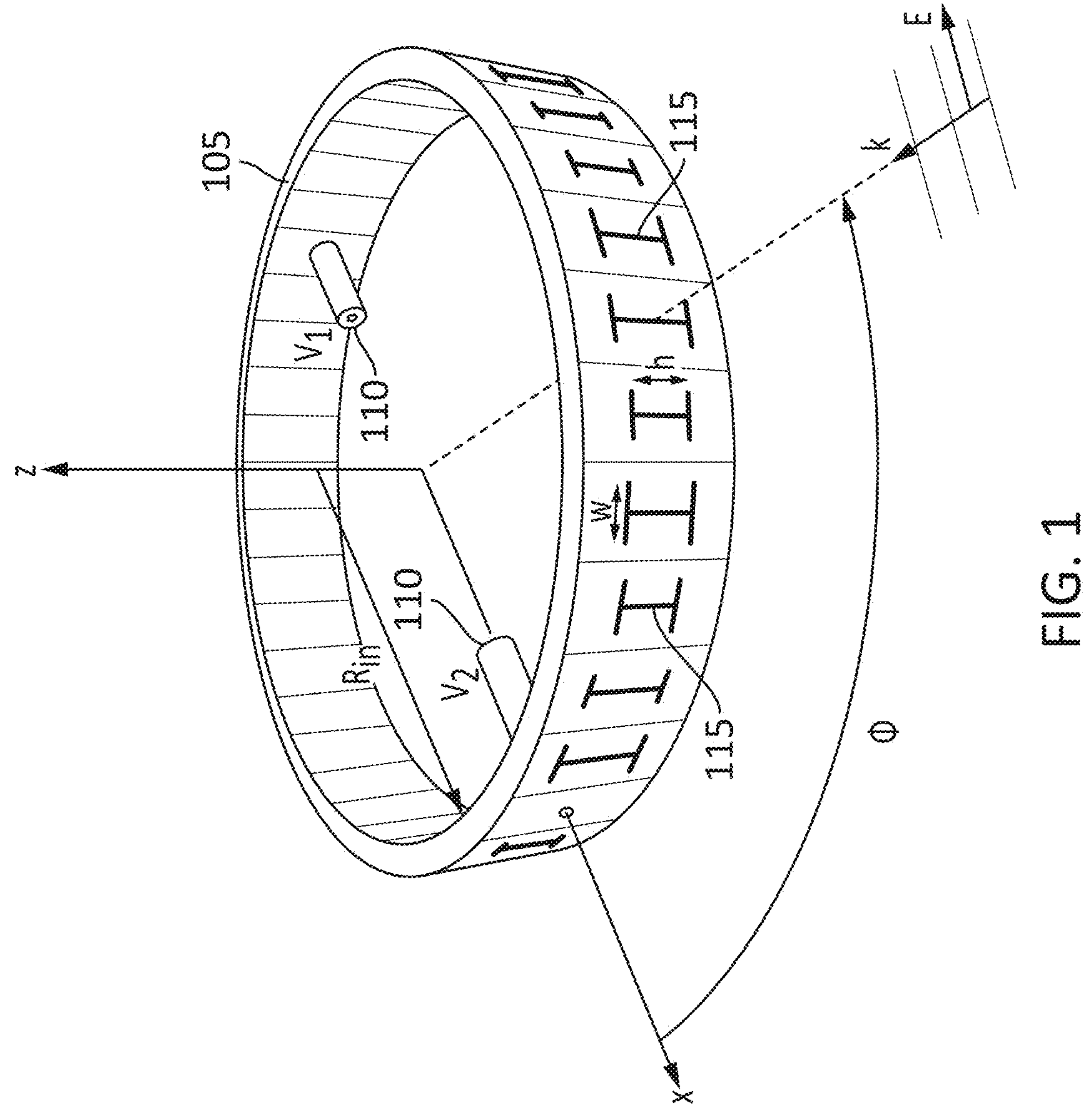
FIG. 1 is a perspective view of an array antenna, according to an embodiment of the present disclosure.

The detailed description set forth below in connection with the appended drawings is intended as a description of exemplary embodiments of a system and method for estimating an angle of arrival provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Each of the drawings is drawn to scale, for a respective embodiment.

Detecting the angle of arrival (AoA) of electromagnetic waves is an important function in a variety of applications such as navigation and wireless communication. In some embodiments, a conformal metasurface antenna (CMA) is used for detecting angle of arrival in the horizontal plane. This structure consists of a conformal waveguide with its upper conductor wall fashioned with metamaterial radiators. The resonance frequencies of the metamaterial radiators may be selected randomly over a band of operation (e.g., they may be nonuniformly distributed, instead of, e.g., being evenly spaced in frequency). The random distribution of resonance frequencies results in patterns that change with frequency and encode information about the angle of arrival of an incident signal into frequency samples (which may also be referred to as "measurements" or "sweeps") which can be analyzed to retrieve the incident angle of arrival. Full-wave simulation may be employed to design and analyze the operation of such a frequency-diverse conformal metasurface antenna. A computational processing technique may be employed to estimate the angle of arrival from the cross correlation of the signals at the end of connectors attached to the conformal metasurface antenna. In some embodiments, the simple and versatile hardware conformal metasurface antenna is able to detect angle of arrival from a single receiver and to find application in wireless communication, surveillance, and navigation systems. As used herein, a "radiator" is a structure for coupling electromagnetic waves propagating in free space to guided electromagnetic waves, or vice versa; as such a radiator may be used transmit or to receive.

In wireless communication, information about angle of arrival may be important to adaptive beamforming and mitigating undesired signal wastage and interference. In tracking devices such as radars, angle of arrival may be continuously tracked to determine the direction of targets. Similarly, autonomous, marine and aerial vehicles may be equipped with direction-finding devices for navigation or surveillance. Furthermore, direction-finding mechanisms may also be leveraged in microwave and synthetic aperture radar (SAR) imaging systems to determine signal scattering characteristics from different directions. Over the years, a plethora of works have been dedicated to the design of antenna hardware or processing algorithms to deduce angle of arrival from planar structures. However, the angle of arrival detection mechanism may better serve many practical purposes when the structure employed to perform such detection can conform to the surface of readily available objects such as helmets, robots, cars, aerial vehicles, or missiles. As a result, it may be advantageous to use conformal antennas and arrays for angle of arrival detection.

Array elements on a conformal surface may be closely spaced to avoid phase ambiguity. As an alternative approach, high-gain array elements may be utilized to mitigate phase ambiguity and improve detection over a wider bandwidth. Design of conformal antennas for angle of arrival detection may thus involve navigating a tradeoff between the size of each element (to increase gain) and the spacing of the adjacent elements, which may become complicated especially when there are other restrictions set by the application. Furthermore, some methods may require using many receiving units which may further complicate the overall cost and complexity. To overcome this issue, some recent works have examined the application of compressive sensing techniques to angle of arrival detection problems. To overcome all these challenges, it is thus highly desired to develop a conformal antenna structure that is simple and versatile and allows for application of compressive angle of arrival detection where only one or a few receiving units are required.

Metasurface antennas may be simple and well-suited for the application of compressive sensing techniques to microwave imaging problems. This is due to the fact that metasurface antennas, when designed properly, may allow for multiplexing of information, a property that may be leveraged to implement compressive sensing techniques. A simple example of such a metasurface antenna is a waveguide or a cavity with one of its conductive walls patterned with metamaterial radiators with randomly selected resonance frequencies. Such a metasurface may (i) generate frequency dependent spatially diverse radiation patterns that illuminate a whole region of interest and (ii) multiplex reflectivity maps into fast frequency sweeps. The frequency measurements made in this manner may then be computationally processed to reconstruct the desired image. This concept may be applied to angle of arrival detection in planar structures as well. In addition to frequency-diverse metasurface antennas, dynamic metasurface antennas, in which each metamaterial radiator is loaded with a switchable component and addressed independently, may be used in computational imaging. This concept may also be extended to angle of arrival detection in planar structures.

In some embodiments, computational angle of arrival detection is performed with conformal metasurface antennas (CMAs). Conformal metasurface antennas may be used for beam steering purposes. In comparison to conventional conformal antennas and arrays, conformal metasurface antennas allow for utilizing numerous radiators close to each other on a conformed surface, eliminating the need for high-gain antennas or issues related to phase ambiguity. Metamaterial radiators may be subwavelength, and, in such a case, they may be implemented easily on any surface of arbitrary curvature. These advantages and the suitability for such structures for implementing compressive sensing techniques (to reduce the number of receivers) may be relevant for the application of a conformal metasurface antenna to angle of arrival detection. As such, the idea of information multiplexing metasurfaces may be extended to conformal structures and a sensing device capable of angle of arrival detection across the entire azimuthal range, i.e., [0°-360°]. The proposed conformal metasurface antenna may generate angularly diverse radiation and receiving patterns as a function of frequency. Using these frequency diverse patterns—which may be characterized using simple cylindrical scans—the angle of arrival of a signal may be multiplexed into simple frequency measurements at a single port. The collected frequency reading may be computationally processed to deduce the incident signal's angle of arrival.

Some embodiments include a conformal waveguide 105 exciting a multitude of metamaterial radiators, as shown in FIG. 1. In some embodiments, a substrate integrated waveguide (SIW) 105 is used since such structures are well suited for implementation of conformal antenna geometries. The substrate integrated waveguide 105 may have the shape of a hollow cylinder (which may conform to the outer surface of a cylinder), as shown in FIG. 1. In other embodiments, any other waveguide geometry may be used instead. In other embodiments, the conformal waveguide 105 may be embedded in (or conformed to) a surface with an arbitrary shape. The substrate integrated waveguide 105 is connected to two coaxial feeds 110 on opposite sides. Coaxial feeds 110 may be used for simplicity of their implementation in a simulation setup. In a practical implementation, the substrate integrated waveguide 105 may be excited via apertures coupled to microstrip lines or from the sides using a coplanar waveguide. Such modifications may not change the principles of operation of such a device for detecting angle of arrival using conformal frequency diverse metasurfaces. For metamaterial radiators, complementary I-shape resonators 115 may be used, due to their simplicity. The resonance frequency of the metamaterial radiators is selected randomly to be within a given band of operation. As the electromagnetic (EM) signal illuminates this metasurface antenna, it couples to a different set of elements 115 depending on their resonance frequency and location along the array. Due to the subwavelength size of the metamaterial radiators 115 (and consequently low gain), they may accept signals from almost all angles in the half-space facing each of them. For example, if a 10 GHz electromagnetic wave illuminates the structure, it may couple to almost all the elements 115—with resonance frequency near 10 GHZ—in the half circle facing that direction. The signal at the end of the coaxial feeds 110 may thus be a random weighted multiplex version of the incident signal where the random weights for each frequency are different. In this manner, information about the angle of arrival may be encoded to frequency measurements at the end of the coaxial connectors.

The cross correlation of the voltage reading at the end of the coaxial feeds 110 may be used as the measured data. The cross correlation of the two signals may be implemented using analog or digital cross correlating circuits.

The cross-correlation may be written $$g = V_1 V_2^* / |V_1 V_2^*|$$

for each frequency point, where $V_1$ and $V_2$ voltages at the end of the coaxial feeds 110, and * denotes complex conjugate. Since the information about the incident angle is present in the phase difference, the amplitude of the measured signal may be disregarded.

In some embodiments, the frequency band of operation is the X band, i.e. 8 GHz-12 GHz. The substrate integrated waveguide 105 may be made of Rogers Duroid™ 5880 with a dielectric constant of 2.2 and a loss tangent of 0.0009. This substrate may be used due to its flexibility and the possibility to conform to arbitrary geometries. To improve the transition from the coaxial connector to the substrate integrated waveguide the thickness of the substrate integrated waveguide may be selected to be 3.1 mm. In other embodiments, the substrate integrated waveguide may be fabricated with 3D printing, or using other flexible substrates. Its thickness may be smaller or greater. The width of the structure may also be greater or smaller. The walls of the substrate integrated waveguide 105 may be via walls, or, especially in lower frequency applications, conductive sheets (e.g., copper tape). For simplicity, the walls of the substrate integrated waveguide may be modeled with conductive boundary conditions (instead of via walls). In some embodiments, the substrate integrated waveguide 105 is separated into compartments by transverse via walls, and each such compartment may have a respective coaxial feed 110. In some embodiments, the substrate integrated waveguide 105 has more than two (e.g., three, four, five, or as many as 15) coaxial feeds 110. These coaxial feeds 110 may be used to calculate pair-wise cross-correlations.

The width of the substrate integrated waveguide may be 15 mm, which corresponds to a cutoff frequency of 6.742 GHz. To simulate the device, the substrate integrated waveguide may be modeled as consisting of a regular polyhedron (e.g., a 36-sided regular polyhedron), with each side of the substrate integrated waveguide 105 containing one metamaterial radiator 115. In a practical implementation, this design may be fabricated to conform to any curvature if needed by bending its flexible substrate. The radius of the polyhedral substrate integrated waveguide may be Rin=45 mm=1.5λ, where λ=30 mm is the wavelength at 10 GHZ.

Figure 2:
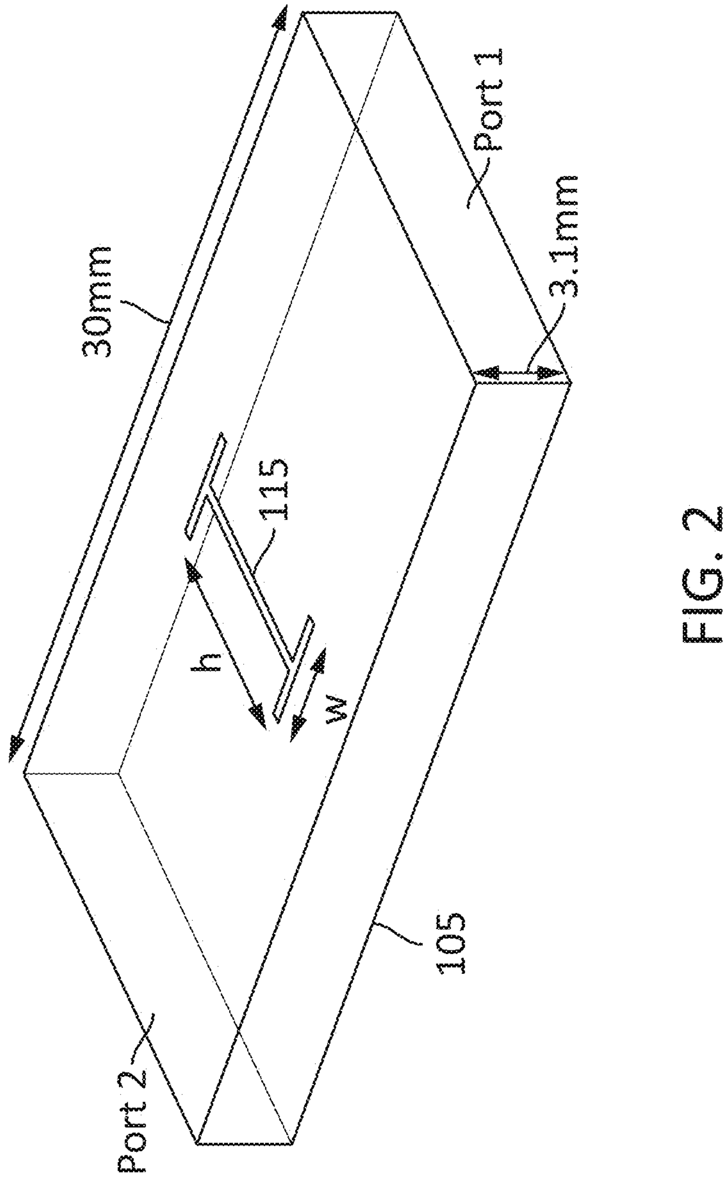
FIG. 2 is a perspective view of a portion of an array antenna, according to an embodiment of the present disclosure.

A first step in the design of this structure may be to find the appropriate combination of length and width for the metamaterial radiators—denoted by h and w in FIG. 1. Toward this goal, Ansys HFSS may be used to simulate a single element in a planar substrate integrated waveguide 105 of the same cross-section as the conformal one, as shown in FIG. 2. The transmission between the two ports of this setup may be simulated for different combinations of h and w. Using this simulation as the guide, each of the elements along the substrate integrated waveguide may be selected to have a width, w, that is a randomly selected value between 6 mm and 9 mm, and a height, h, that is a randomly selected value between 3 mm and 5 mm. The opening of the I-shape of the metamaterial radiator may be selected to be 0.5 mm.

The conformal metasurface antenna designed in this manner may be simulated to analyze its radiation pattern (or reception pattern by reciprocity). To reduce the simulation complexity and time, the structure may be placed between a parallel plate waveguide made of perfect magnetic conducting walls. This way, the studies may be confined to a quasi-two-dimensional (quasi-2D) simulation where the transmitted or incident electric fields are assumed to be polarized horizontally. The radiation patterns of this structure for the case when both connectors are excited exhibit clear changes as a function of frequency, thereby verifying the hypothesis that this device has frequency-diverse angularly distinct receiving patterns. For example, 41 frequency points uniformly distributed over the X band (spacing of 100 MHz) may be used. All angles are received with fairly reasonable strength by this device over the band of operation, i.e., approximating an omnidirectional pattern with angular selectivity.

To utilize the frequency-diverse patterns for angle of arrival detection, the following procedure may be used. The first step is to discretize the range of angle of arrivals (i.e. [0°-360°]) into N bins. Next, the structure may be simulated in Ansys HFSS with plane waves arriving from the angles at the center of the bins, i.e., $\phi_{ref}$. The voltages at the ends of the coaxial feeds 110 (terminated in an absorbing boundary condition) are computed numerically and correlated with each other. In this manner, an M×N reference matrix H for all N reference angles and M frequency points may be formed. The mn entry of this matrix for the $m^{th}$ frequency point, $f_m$, and $n^{th}$ reference angle, $$\phi_{ref}^{n},$$

is thus given as $$h_{mn} = V_1 V_2^* / |V_1 V_2^*| \text{ for } f_m, \phi_{ref}^{n} \tag{1}$$

In practice, the reference matrix may be populated by placing the metasurface on a rotation stage while a transmitting antenna illuminates it from a distance. When the cross correlation of the received signals is used, the reference matrix is independent of the incident signal's phase reference (i.e., the radial distance of the source).

If the incident signal was received from one of the reference directions, the received signal, g, may be written as $$g_{M\times 1} = H_{M\times N} f_{N\times 1} \tag{2}$$

where $f_{N\times 1}$ is a vector whose $n^{th}$ entry is (i) 1 if the incident signal is from the $n^{th}$ reference angle and (ii) zero otherwise.

f may then be estimated, based on g, using Equation (2). However, H is not a square matrix, and its inverse is not defined. Furthermore, the incident signal may be from directions other than the reference angle. As a result, f may then be estimated by using computational techniques. For example, a least square solver method (e.g., the least square solver method implemented as Isqr in MATLAB™) may be used.

Figure 3:
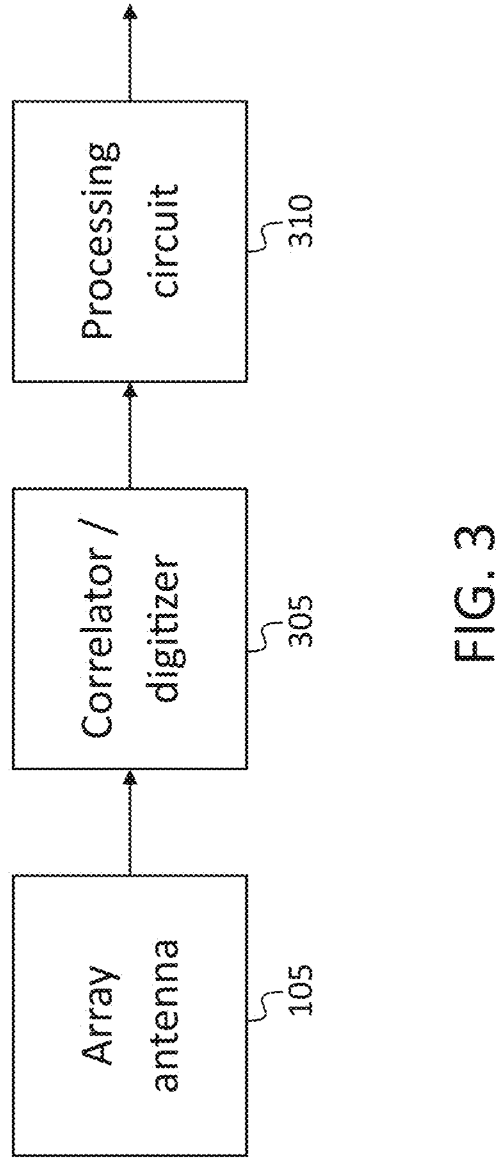
FIG. 3 is a system level block diagram, according to an embodiment of the present disclosure.

Referring to FIG. 3, in some embodiments, the array antenna 105 is connected (via the coaxial feeds 110) to a radio frequency front end (an RF front end) 305 which may include a cross correlating circuit (or "correlator") and a digitizer (which may be or include one or more analog to digital converters). The cross correlation may be calculated before digitization or after digitization. The RF front end 305 may also amplify the received signal at each of the two feeds. The output of the RF front end 305 may be fed to a processing circuit 310 (discussed in further detail below), which may estimate the angle of arrival from the digitized cross correlation signal as discussed in further detail above, and below. In some embodiments, the processing circuit may receive the signal from the array antenna (e.g., it may receive it in digital form, from the RF front end), and estimate the angle of arrival of the electromagnetic signal received by the antenna. The processing circuit may, for example, calculate the normalized cross correlation at each frequency (to form a normalized cross correlation vector; in some embodiments, as mentioned above, the normalized cross correlation is instead determined using the analog signal, before digitization), and it may use any of various numerical methods to calculate an estimated angle of arrival, the estimated angle of arrival being one that is in some sense consistent with the calculated normalized cross correlation vector. For example, the processing circuit may find an angle of arrival for which a discrepancy is minimized, the discrepancy being a measure of the difference between a reference normalized cross correlation vector and the measured normalized cross correlation vector. The reference normalized cross correlation vector may have been previously determined, for example, (i) by simulation, or (ii) empirically, using radiation with a known angle of arrival. For example, it may iteratively select tentative angles of arrival, generally selecting the next tentative angle of arrival to have a value expected to result in a reduced discrepancy, and eventually selecting, as the estimated angle of arrival, a tentative angle of arrival, of the set tested, for which the discrepancy is smallest. In some embodiments, ridge regression or Tikhonov regularization may be used to find the angle of arrival.

The result may be a vector $f_{est}$, which has a peak closest to the actual angle of arrival. Any angle of arrival may thus be estimated by the reference angle closest to it. In some embodiments, N=72 reference angles, separated by 0.0873 rad (≈5 degrees) are used. Denser discretization of the azimuth plane may be possible but may require a longer simulation. The resolution of such a device, based on a uniform circular array calculation, for an inner radius of 45 mm and a frequency of 10 GHZ, may be around 13.5 degrees. In general, the resolution may be set by the size of the structure and frequency of operation. For example, if the device is implemented on a radius of 9 cm, the resolution may be decreased from 13.5 degrees by almost a factor of 2. However, if prior knowledge that a single (predominant) signal is incident on the device, is used, it may be possible to detect the angle of arrival with higher resolution, hence justifying using dense discretization (bin size of 5 degrees instead of 13.5 degrees).

The ability to solve the inverse problem at the heart of the angle of arrival detection (e.g., solving equation (2)) depends on the number of measurements, M, i.e., frequency points. However, increasing the number of frequency points may not necessarily yield new information since samples at frequencies that are too close to each other are correlated. To assess the quality of measurements, the singular value decomposition of the sensing matrix, H, for different numbers of frequency points can be calculated. By analyzing the singular values, it may be seen that increasing the number of frequency points yields a diminishing return. As a compromise between simulation time and measurement diversity, frequency points with 100 MHz spacing may be used.

The device may have the ability to detect angles of arrival over the whole horizontal plane even for sources which may not have constant amplitude or are at a different distance from the one used for the simulation used for populating the sensing matrix H. In some applications the method may operate over a narrower band of operation. However, operating over an increasingly narrow frequency band may require using more iterations of the least squares solver to deliver desired performance, as the inverse problem becomes more ill-conditioned—since the number of measurements, M is reduced.

From a practical perspective, some embodiments may be embedded into any shape or configuration. Some embodiments (e.g., the design of FIG. 1) are not designed to necessarily form directive beams; their fabrication may not be restricted by strict requirements, and any deformation or defect may be accounted for during calibration. Further, some embodiments use only a single receiver and only require a frequency sweep, which may be implemented at a low cost. Such a versatile and simple structure for finding angle of arrival may find application in navigation systems, radars, and wireless communication networks.

Various variations on the embodiment of FIG. 1 may be constructed. Such variations may use variations in the constitutive element or variations in the substrate integrated waveguide (or both). The constitutive element may be varied as follows. In the embodiment of FIG. 1, I-shaped slots are used, which may have a wideband response (low Q-factor) and may be single-polarized. Complementary electric-inductive-capacitive (cELC) configurations may improve the quality factor (and provide a narrowband response). FIG. 4 shows four examples of different possible cELC geometries. Both I-shaped slots and cECLs may be subwavelength, allowing many elements to be placed near each other. Both elements also may have low-gain radiation patterns, allowing for capturing signals from all directions.

The constitutive elements may exhibit low reflection and low coupling to the waveguide. This way, all of the elements along the metasurface may contribute to the overall radiation. The resonance frequency of the element may be adjusted by changing its geometrical properties. The coupling and reflection of the wave may be controlled by altering the element's placement. By increasing the distance from the center of the waveguide 105 (e.g., moving it from the center of the waveguide 105, as shown in FIG. 5A, to the edge of the waveguide as shown in FIG. 5B), the element's coupling may be reduced, and the reflection coefficient may be improved. The system may be operated in different polarizations by rotating the element (see FIG. 5C) or by using asymmetric elements.

Figure 6:
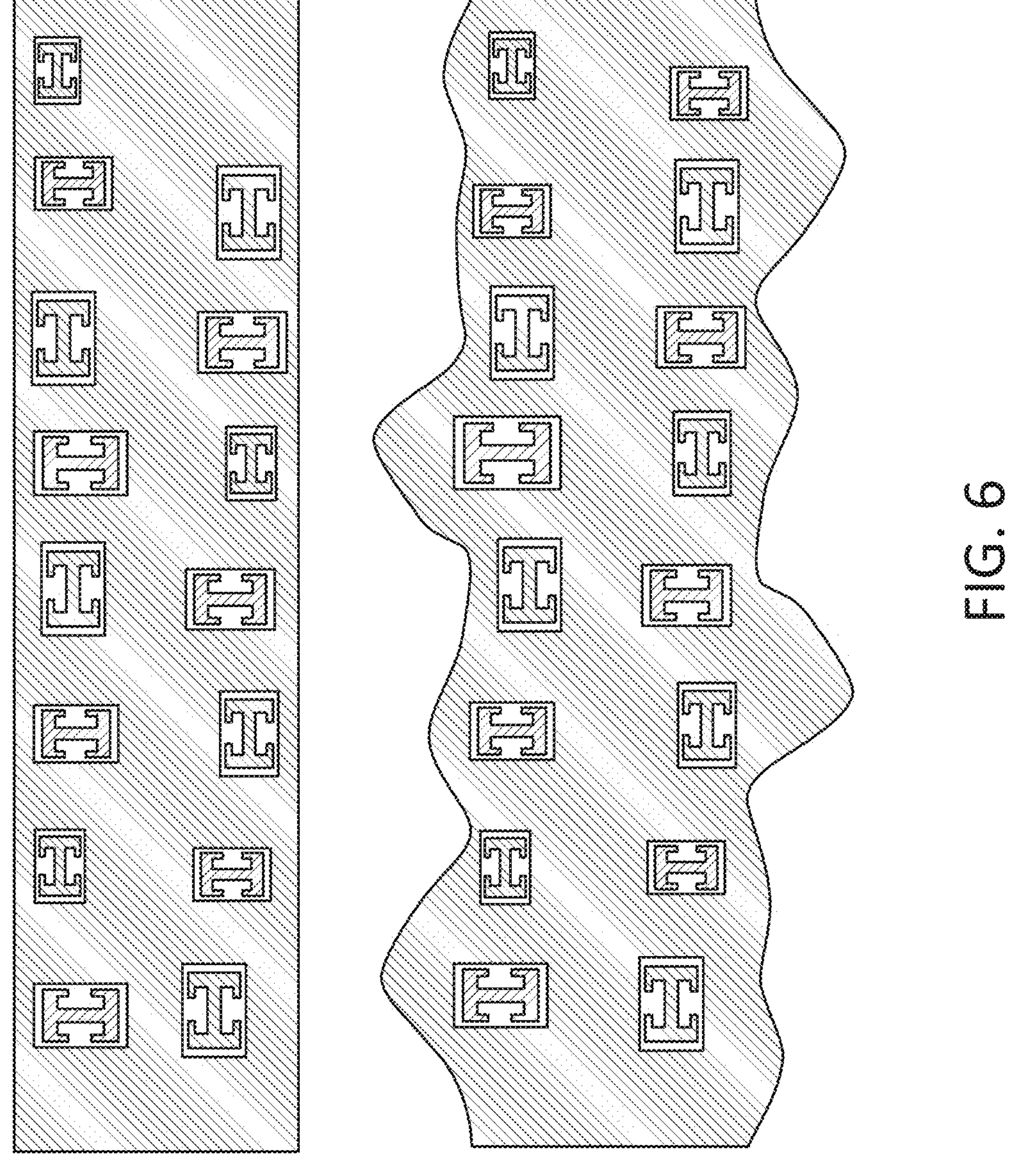
FIG. 6 is a plan view of each of two waveguide and radiator geometries, according to an embodiment of the present disclosure.

The geometric parameters of the substrate integrated waveguide 105 that may be varied include the thickness, curvature, width, and shape. The specific application, mechanical constraints, and available material may determine the thickness and curvature of the substrate integrated waveguide 105. The curvature of the substrate integrated waveguide 105 may be large enough for the signal to propagate along it. The shape of the conformal substrate integrated waveguide 105 may be arbitrary and does not need to be circular. The width of the substrate integrated waveguide 105 may determine the cutoff frequency. The substrate integrated waveguide 105 may be designed to operate with multiple modes. The width of the substrate integrated waveguide 105 does not need to be fixed. It may change as it wraps around the structure. Such a configuration may create a disordered structure (examples of which are shown in FIG. 6) that may increase frequency diversity. The SIW may wrap around the whole structure or may be terminated in a metallic wall. The feed or feeds may be coaxial connectors, another substrate integrated waveguide, a microstrip, or a rectangular waveguide.

In some embodiments, the performance is improved by using more elements or by introducing other sources of frequency diversity (such as a planar cavity). Alternatively, the number of measurements may be increased by using more receiving units. In some embodiments, more complex compressive sensing techniques or machine learning algorithms are employed instead of simple least-square solvers; this may improve the detection performance. To lessen the dependence on bandwidth, a conformal dynamic metasurface antenna where each metamaterial radiator is loaded with a switchable component and addressed independently may be implemented. Such a structure may detect angles of arrival using a single frequency of operation, and using only the intensity of the received signal.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X−Y and the second quantity is at most X+Y. As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

Each of the terms "processing circuit" and "means for processing" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

Although exemplary embodiments of a system and method for estimating an angle of arrival have been specifically described and illustrated herein, many modifications and variations will be apparent to those skilled in the art. Accordingly, it is to be understood that a system and method for estimating an angle of arrival constructed according to principles of this disclosure may be embodied other than as specifically described herein. The invention is also defined in the following claims, and equivalents thereof.

What is claimed is:

1. A system, comprising:

an array antenna;

a radio frequency (RF) front end; and a processing circuit, the array antenna being curved, the array antenna comprising a plurality of radiators, including a first radiator having a first resonant frequency and a second radiator having a second resonant frequency different from the first resonant frequency, the plurality of radiators comprising at least 10 radiators, the processing circuit being configured to receive a signal from the array antenna and to calculate, from the signal, an estimated angle of arrival of electromagnetic radiation corresponding to the signal, wherein:

the array antenna comprises a substrate integrated waveguide, the substrate integrated waveguide has the shape of a hollow cylinder, the array antenna has a first feed and a second feed, the two feeds are at diametrically opposed positions on the hollow cylinder, and the calculating of the angle of arrival comprises calculating a normalized cross correlation vector, the normalized cross correlation vector comprising, for each of a plurality of frequency points, a normalized cross correlation of a signal at the first feed and a signal at the second feed.

2. The system of claim 1, wherein:

the first radiator is a complementary I-shaped resonator, and the second radiator is a complementary I-shaped resonator.

3. The system of claim 1, wherein the radiators of the plurality of radiators are uniformly spaced around the hollow cylinder.

4. The system of claim 3, wherein each of the plurality of radiators has a respective resonant frequency, the respective resonant frequencies being nonuniformly distributed.

5. The system of claim 1, wherein the calculating further comprises:

calculating, for a first tentative angle of arrival, a first discrepancy, the first discrepancy being a measure of the difference between a reference normalized cross correlation vector and the calculated normalized cross correlation vector;

calculating, for a second tentative angle of arrival, a second discrepancy, the second discrepancy being a measure of the difference between a reference normalized cross correlation vector and the calculated normalized cross correlation vector;

determining that the first discrepancy is greater than the second discrepancy; and setting the estimated angle of arrival equal to the second tentative angle of arrival.

6. The system of claim 1, wherein the calculating further comprises calculating the estimated angle of arrival using ridge regression based on a reference response of the array antenna for a plurality of angles of arrival.

7. A method, comprising:

receiving an electromagnetic signal with an array antenna, to generate an antenna signal; and calculating, by a processing circuit, from the antenna signal, an estimated angle of arrival of the electromagnetic signal, wherein:

the array antenna is curved, the array antenna has a first feed and a second feed, the array antenna comprises a first radiator having a first resonant frequency and a second radiator having a second resonant frequency different from the first resonant frequency, and the calculating of the angle of arrival comprises calculating a normalized cross correlation vector, the normalized cross correlation vector comprising, for each of a plurality of frequency points, a normalized cross correlation of a signal at the first feed and a signal at the second feed.

8. The method of claim 7, wherein:

the first radiator is a complementary I-shaped resonator, and the second radiator is a complementary I-shaped resonator.

9. The method of claim 7, wherein the array antenna comprises a substrate integrated waveguide.

10. The method of claim 9, wherein the array antenna comprises a plurality of radiators, including the first radiator and the second radiator, the plurality of radiators comprising at least 10 radiators.

11. The method of claim 10, wherein the substrate integrated waveguide has the shape of a hollow cylinder.

12. The method of claim 7, wherein the calculating further comprises:

calculating, for a first tentative angle of arrival, a first discrepancy, the first discrepancy being a measure of the difference between a reference normalized cross correlation vector and the calculated normalized cross correlation vector;

calculating, for a second tentative angle of arrival, a second discrepancy, the second discrepancy being a measure of the difference between a reference normalized cross correlation vector and the calculated normalized cross correlation vector;

determining that the first discrepancy is greater than the second discrepancy; and setting the estimated angle of arrival equal to the second tentative angle of arrival.

13. The method of claim 7, wherein the calculating further comprises calculating the estimated angle of arrival using ridge regression based on a reference response of the array antenna for a plurality of angles of arrival.

* * * * *